(12) United States Patent
Waldron-Floyde et al.

(10) Patent No.: US 6,648,204 B2
(45) Date of Patent: Nov. 18, 2003

(54) ALIGNMENT WEIGHT FOR FLOATING PIN FIELD DESIGN

(75) Inventors: Cheryl M. Waldron-Floyde, Aloha, OR (US); Brad C. Irwin, Placerville, CA (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/754,714

(22) Filed: Jan. 4, 2001

(65) Prior Publication Data

US 2001/0001889 A1 May 31, 2001

Related U.S. Application Data

(62) Division of application No. 09/288,486, filed on Apr. 8, 1999, now Pat. No. 6,206,272.

(51) Int. Cl.[7] ............................................. B23K 37/04
(52) U.S. Cl. ........................................................ 228/44.7
(58) Field of Search ................. 29/843, 830; 174/260; 361/784; 228/44.7, 44.3, 33, 59

(56) References Cited

U.S. PATENT DOCUMENTS

| | | |
|---|---|---|
| 3,737,998 A | 6/1973 | Byrd ............................ 29/627 |
| 4,705,205 A | 11/1987 | Allen et al. ............... 228/180.2 |
| 4,741,090 A | 5/1988 | Monnier ....................... 29/464 |
| 4,835,344 A | 5/1989 | Iyogi et al. ................. 174/68.5 |
| 4,968,263 A | 11/1990 | Silbernagel et al. ......... 439/246 |
| 4,970,781 A * | 11/1990 | Chang et al. |
| 5,029,748 A | 7/1991 | Lauterbach et al. ...... 228/180.1 |
| 5,400,502 A | 3/1995 | Ota et al. ....................... 29/845 |
| 5,656,862 A * | 8/1997 | Papathomas et al. |
| 5,663,106 A * | 9/1997 | Karavakis et al. |
| 5,743,009 A * | 4/1998 | Matsui et al. |
| 5,927,589 A | 7/1999 | Yang ........................... 228/44.7 |
| 5,928,005 A | 7/1999 | Li et al. ........................ 439/82 |
| 6,027,590 A | 2/2000 | Sylvester et al. ............ 156/150 |

OTHER PUBLICATIONS

*In: ASM Handbook, vol. 6: Welding, Brazing and Soldering,* Olsen, D.L., et al., vol. Chairmen, 993–995, (1993).

* cited by examiner

*Primary Examiner*—M. Alexandra Elve
*Assistant Examiner*—Jonathan Johnson
(74) *Attorney, Agent, or Firm*—Schwegman, Lundberg, Woessner & Kluth, P.A.

(57) ABSTRACT

An alignment weight is provided. The alignment weight includes a body of material having first and second opposing surfaces. A number of depressions are formed in the first surface. The depressions receive pins of a floating pin field when placed on a floating pin field during connection of the floating pin field to a printed circuit board.

18 Claims, 4 Drawing Sheets

ALIGNMENT WEIGHT FOR FLOATING PIN FIELD DESIGN

This application is a divisional of U.S. Ser. No. 09/288,486, filed Apr. 8, 1999 now U.S. Pat. No. 6,206,272.

TECHNICAL FIELD OF THE INVENTION

The present invention relates generally to the field of electronic circuits and, in particular, to an alignment weight for an electronic circuit with a floating pin field design.

BACKGROUND

Integrated circuits are a common part of modern electronic equipment. Integrated circuits typically include a large number of transistors and other circuit elements that are interconnected on a common semiconductor chip or die. Typically, integrated circuits are packaged independently and interconnected on a printed circuit board for installation in an electronic system, such as a computer.

A printed circuit board can be connected to an electronic system in a number of ways. For example, a printed circuit board can include a "floating pin field" on one side of the printed circuit board. The floating pin field includes a number of pins that are held in a fixed spatial relation by a pin field carrier through which the pins pass. The pins are electrically connected to circuit elements on the printed circuit board. A floating pin field design may be used, for example, with a printed circuit board containing an upgraded processor for a computer.

When a floating pin field design is used, the printed circuit board may be connected to a system through a socket such as a socket located on a mother board of a computer system. The socket typically includes a number of receptacles that are placed around a perimeter of the socket. The receptacles receive the pins of the floating pin field.

One problem with printed circuit boards that use a floating pin field design is in the process for soldering the pins to the bottom of the printed circuit board. Generally, the pins are held in place with a pin field carrier. The printed circuit board is patterned with a solder paste at the locations where the pins are to connect to the printed circuit board. The pins and the pin field carrier are placed on the board and the solder undergoes a reflow process. Unfortunately, sometimes not all of the solder joints created with this reflow process provide acceptable connection between the pin and the circuit elements on the printed circuit board. For example, so-called "solder bridges"—solder material that extends over a significant distance between a pin and the printed circuit board—can be formed, for example, when a pin moves away from the printed circuit board during the reflow process. These solder bridges provide a poor, brittle mechanical connection for the pin and can lead to open solder joints during use. Furthermore, when an open solder joint is detected after production, the part is typically disposed of since rework of the open solder joints is overly burdensome. This can result in a significant waste of resources in fabricating electronic modules using floating pin fields.

For the reasons stated above, and for other reasons stated below which will become apparent to those skilled in the art upon reading and understanding the present specification, there is a need in the art for a more reliable technique for producing acceptable solder joints in an electronic module using a floating pin field design.

SUMMARY

The above mentioned problems with electronic modules using a floating pin field design and other problems are addressed by the present invention and will be understood by reading and studying the following specification. An alignment weight is described which is used to hold the pins in place during a reflow process.

In one embodiment, an alignment weight is provided. The alignment weight includes a body of material having first and second opposing surfaces. A number of depressions are formed in the first surface. The depressions receive pins of a floating pin field when placed on a floating pin field during connection of the floating pin field to a printed circuit board.

DETAILED DESCRIPTION

The following detailed description refers to the accompanying drawings which form a part of the specification. The drawings show, and the detailed description describes, by way of illustration specific illustrative embodiments in which the invention may be practiced. These embodiments are described in sufficient detail to enable those skilled in the art to practice the invention. Other embodiments may be used and logical, mechanical and electrical changes may be made without departing from the scope of the present invention. The following detailed description is, therefore, not to be taken in a limiting sense.

Figure 1:
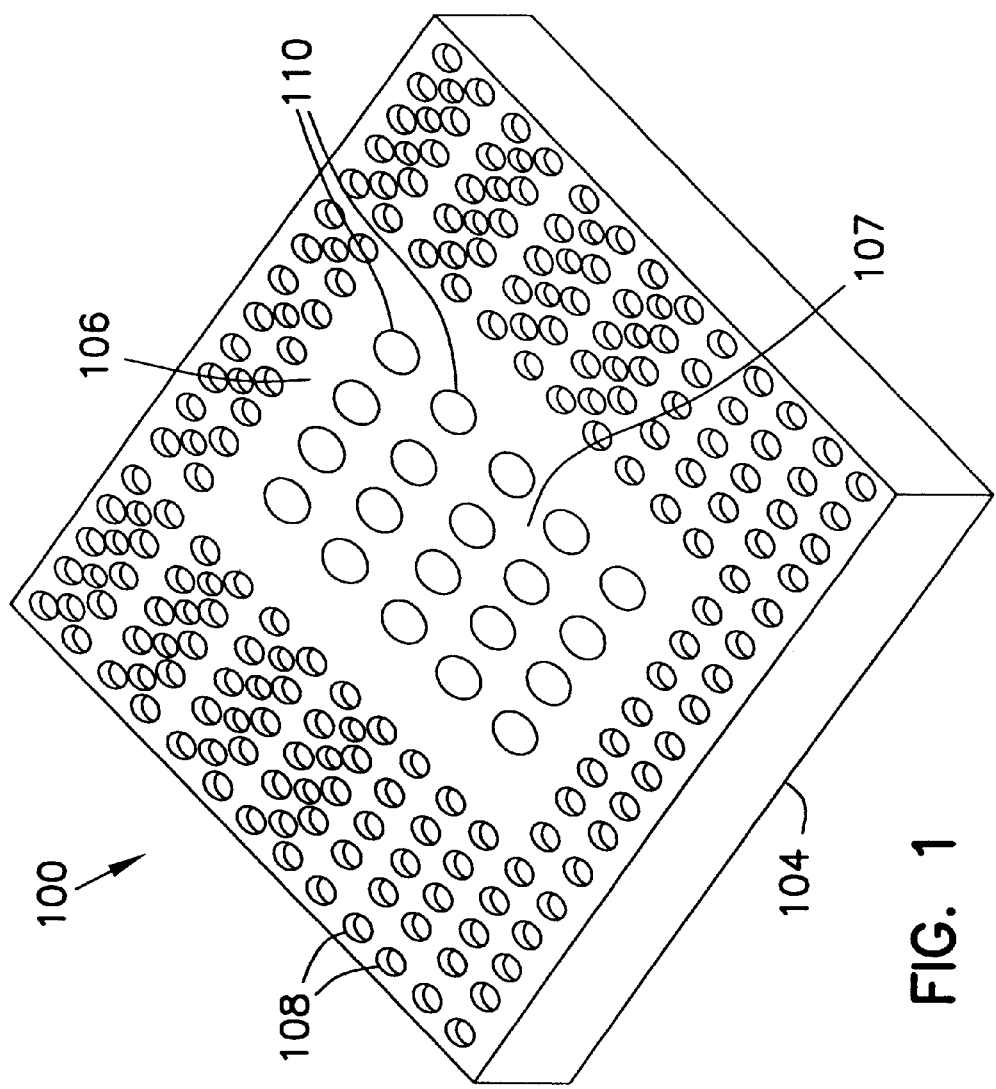
FIG. 1 is a perspective view of an illustrative embodiment of an alignment weight according to the teachings of the present invention.

FIG. 1 is a perspective view of an illustrative embodiment of an alignment weight indicated generally at 100 and constructed according to the teachings of the present invention. Alignment weight 100 is used in a process for connecting pins of a floating pin field to a printed circuit board. Specifically, alignment weight 100 is designed to provide a downward force that helps to secure pins in place during a solder reflow process and to maintain the pins in a substantially straight-up alignment. Advantageously, alignment weight 100 also maintains the ends of the pins of the floating pin field substantially in the same plane.

Alignment weight 100 is formed from a material that can withstand the heat of a solder reflow process without significant warping. Further, the material has sufficient weight to provide downward force on the pins to assure the creation of an acceptable solder joint. For example, in one embodiment, alignment weight 100 is formed from Ultem® PolyEtherImide material, e.g., Ultem® 2300, commercially available from Ensiger Corporation. Ultem is an amber transparent high performance polymer which combines high strength and rigidity at elevated temperatures with long term heat resistance. Other appropriate materials can be used to produce the body of alignment weight 100.

Figure 2:
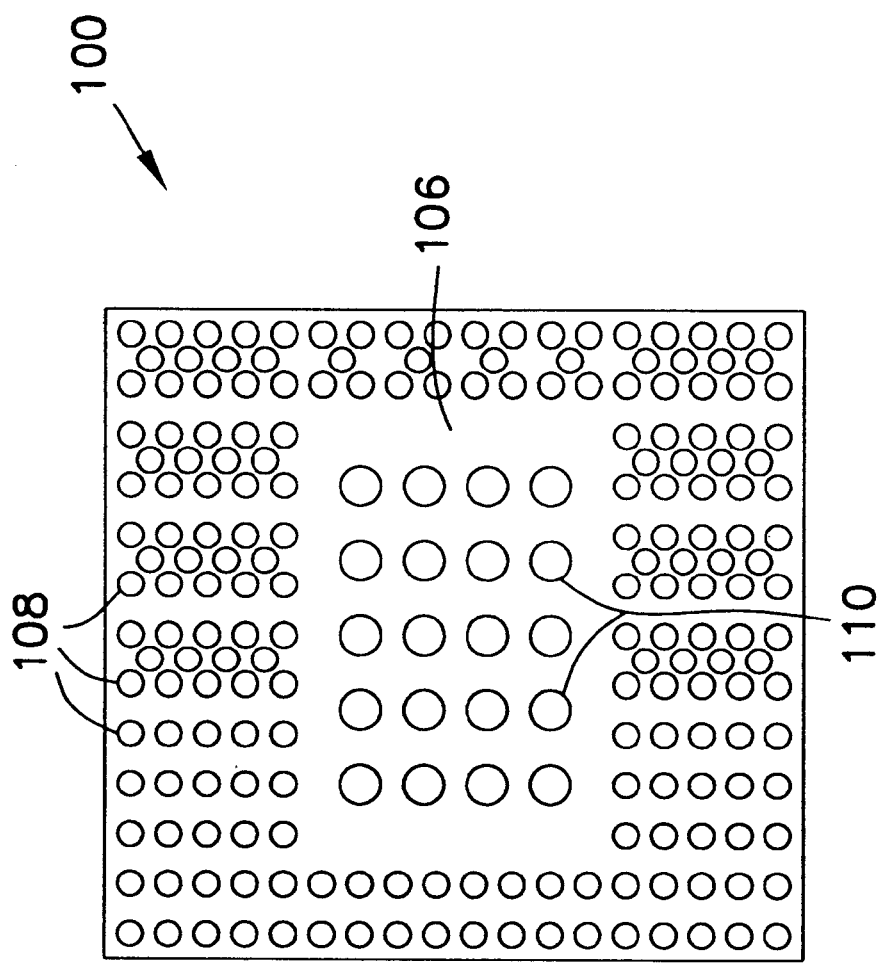
FIG. 2 is a bottom view of the alignment weight of FIG. 1.

Alignment weight 100 includes first and second opposing surfaces 104 and 106, respectively. Surface 106 includes a number of depressions 108. Depressions 108 are disposed in surface 106 in positions that correspond to the locations of pins in a floating pin field to be used with alignment weight 100. In one embodiment, depressions 108 are disposed in rows around the perimeter of surface 106 as shown in FIGS. 1 and 2. However, it is understood that depressions 108 can be disposed at other locations on surface 106 so as to accommodate the layout of other floating pin field designs.

The size of depressions 108 may be selected to assure proper vertical alignment of the pins of the floating pin field. For example, when the pins have a diameter of approximately 0.01±0.001 inches, depressions 108 may be formed with an outer diameter at surface 106 of 0.065 inches with an interior angle of 82 degrees and an inner diameter of 0.055 inches.

Alignment weight 100 further includes holes 110 that extend through a thickness of alignment weight 100 in center region 107. Holes 110 allow heat to flow through alignment weight 100 toward a printed circuit board located below alignment weight 100 during a reflow process. This allows elements other than pins to be soldered beneath the alignment weight when the pins are soldered in place.

In this embodiment, holes 110 are laid out in an array in center region 107. However, it is understood that holes 110 can be located at other positions in alignment weight 100. Further, holes 110 are shown as cylindrical passages through alignment weight 100. Holes 110 can, however, have different sizes and shapes and are not limited to the embodiment shown.

In some embodiments, holes 110 can be omitted when only pins are soldered during a reflow process and no other elements are placed on printed circuit board 304 beneath alignment weight 100.

Figure 3:
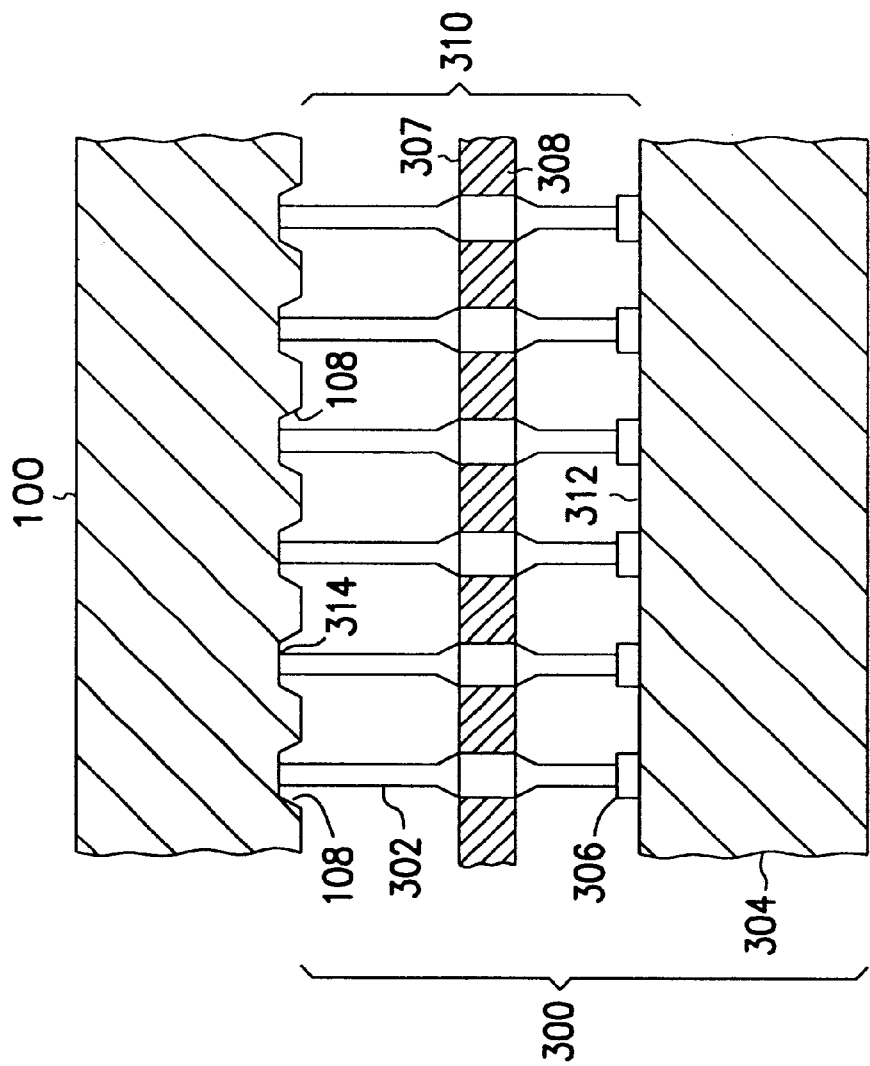
FIG. 3 is a cross-sectional view of a portion of an embodiment of an electronic module during production with an alignment weight in place according to the teachings of the present invention.

FIG. 3 is a cross-sectional view of a portion of an embodiment of an electronic module 300 during production with alignment weight 100 in place according to the teachings of the present invention. Alignment weight 100 is used to assure proper contact between pins 302 and printed circuit board 304 at solder contacts 306. Advantagously, alignment weight 100 maintains ends 314 of pins 302 in substantially the same plane. This reduces the likelihood that solder bridges will form at the base of any of pins 302.

Pins 302 are held in a fixed alignment by field carrier 308. Field carrier 308 is formed from flame retardant 4 (FR4) material with holes for receiving pins 302. Field carrier 308 holds the pins in a position that is substantially normal to surface 307 of field carrier 308. Pins 302 and field carrier 308 form floating pin field 310.

Floating pin field 310 is placed in contact with screen printed solder paste on surface 312 of printed circuit board 304 at connection points for pins 302. With floating pin field 310 in place, alignment weight 100 is placed over ends 314 of pins 302 such that depressions 108 align with ends 314 of pins 302. Electronic module 300 along with alignment weight 100 undergo a solder reflow process to form contacts 306. Alignment weight 100 is then removed.

Figure 4:
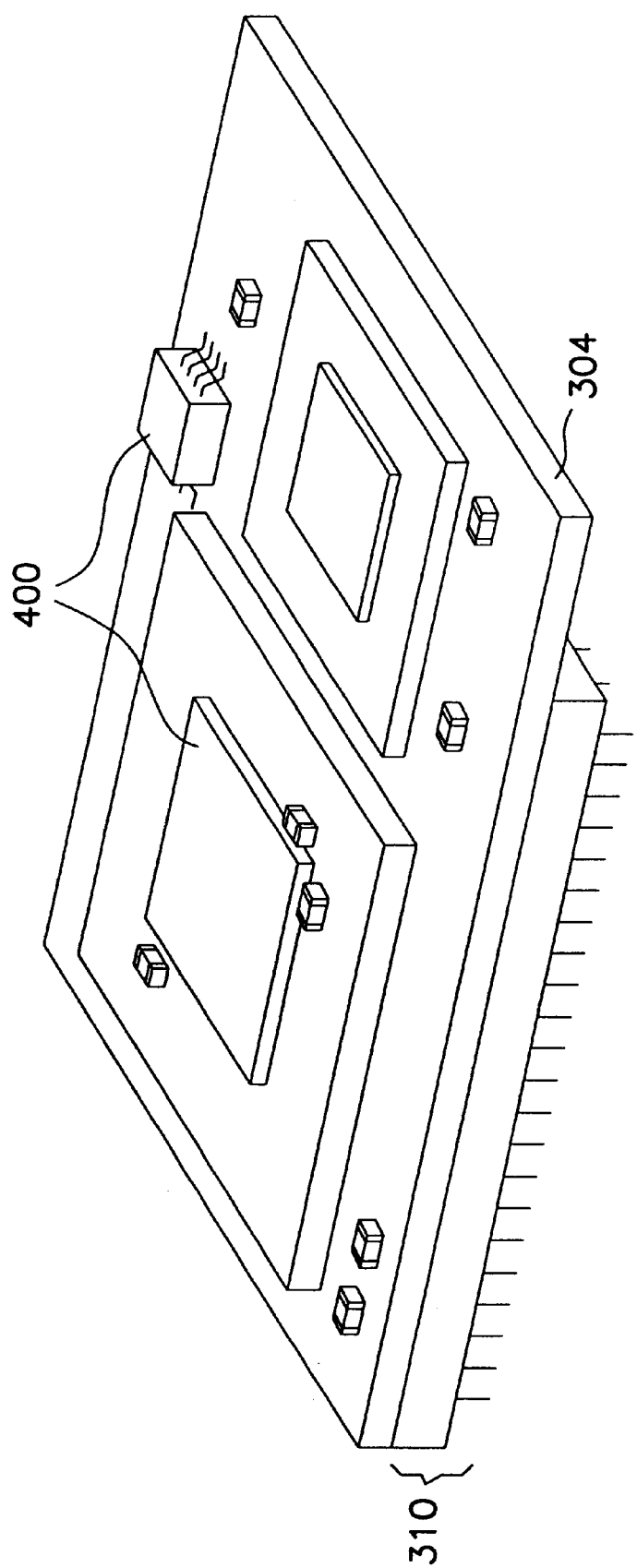
FIG. 4 is a perspective view of an embodiment of an electronic system module with a floating pin field constructed using the alignment weight according to the teachings of the present invention.

As shown in FIG. 4, additional circuit components 400 are coupled to printed circuit board 304 using, for example, surface mount technology. For example, an upgraded microprocessor can be coupled to the printed circuit board for insertion into a computer system on printed circuit board 304.

Although specific embodiments have been illustrated and described herein, it will be appreciated by those of ordinary skill in the art that any arrangement which is calculated to achieve the same purpose may be substituted for the specific embodiment shown. This application is intended to cover any adaptations or variations of the present invention. For example, the alignment weight can be used with floating pin fields for electronic modules other than a processor upgrade. Further, the location, depth, diameter, and interior angle of the depressions 108 can be varied as necessary for a particular pin field. Further, alignment weight 100 can be formed without holes 110. Further, circuit components 400 can be coupled to both sides of printed circuit board 304. Other materials that are resistant to warping at elevated temperatures and that provide sufficient weight to aid in improving the solder bonds can be used for the alignment weight 100 in place of the Ultem material described above. Other bonding materials can be used in place of solder to connect pins 302 with printed circuit board 304.

What is claimed is:

1. An alignment weight, comprising:
   a body of material having first and second opposing surfaces; and
   a number of depressions formed in the first surface so as to receive pins of a floating pin field when placed on a floating pin field during connection of the floating pin field to a printed circuit board, wherein each of the depressions is configured to receive only one of the pins, and wherein the body comprises a PolyEtherImide material.

2. An alignment weight comprising:
   a surface with a plurality of depressions, the plurality of depressions being arranged on the surface to accept a plurality of pins to be aligned, wherein each of the plurality of depressions is arranged to accept a corresponding one of the plurality of pins, and the plurality of depressions are arranged to align the plurality of pins in substantially the same plane; and
   a second surface opposite the first surface to form a body therebetween, the body including a plurality of holes from the first surface to the second surface, wherein the plurality of depressions are arranged around a perimeter of the surface, and the plurality of holes are arranged near a center of the surface.

3. The alignment weight of claim 2 wherein each of the plurality of holes is substantially cylindrical.

4. The alignment weight of claim 2 wherein the first and second surfaces are substantially parallel.

5. The alignment weight of claim 2 wherein the alignment weight comprises a material of sufficient weight to provide a downward force on the plurality of pins to assure alignment thereof.

6. The alignment weight of claim 5 wherein the material exhibits substantially no warping at temperatures high enough to provide solder reflow.

7. The alignment weight of claim 6 wherein the material comprises PolyEtherImide.

8. The alignment weight of claim 2 wherein the plurality of depressions have an interior angle of less than 90 degrees.

9. The alignment weight of claim 8 wherein the plurality of depression have in interior angle of substantially 82 degrees.

10. An alignment weight comprising first and second opposing surfaces having a material therebetween, the first surface having a plurality of circular depressions with an inner diameter and an outer diameter, and the material having a plurality of holes extending from the first surface to the second surface, wherein the plurality of circular depressions are arranged around a perimeter of the alignment weight, and the plurality of holes are arranged near a center of the alignment weight.

11. The alignment weight of claim 10 wherein the inner diameter is smaller than the outer diameter.

12. The alignment weight of claim 10 wherein an interior angle exists within each of the plurality of depressions, the interior angle being less than 90 degrees.

13. The alignment weight of claim 10 wherein the material comprises PolyEtherImide.

14. The alignment weight of claim 10 wherein the inner diameter of the plurality of depressions are in substantially the same plane.

15. An alignment weight comprising:
a body having first and second opposing surfaces, and having a plurality of passages extending from the first surface to the second surface, the plurality of passages being laid out in a center region of the first surface; and
depressions disposed in rows about a perimeter of the first surface, wherein each of the depressions is configured to receive only one pin of a floating pin field during connection of the floating pin field to a printed circuit board.

16. The alignment weight of claim 15 wherein the plurality of passages are cylindrical.

17. The alignment weight of claim 15 wherein each of the depressions has an outer diameter at the first surface of substantially 0.65 inches.

18. The alignment weight of claim 15 wherein the plurality of passages are laid out in an array in the center region of the first surface.

* * * * *

UNITED STATES PATENT AND TRADEMARK OFFICE
CERTIFICATE OF CORRECTION

PATENT NO.    : 6,648,204 B2
DATED         : November 18, 2003
INVENTOR(S)   : Waldron-Floyde et al.

It is certified that error appears in the above-identified patent and that said Letters Patent is hereby corrected as shown below:

Column 5,
Line 10, delete "depression" and insert -- depressions --, therefor.
Line 10, delete "in" and insert -- an --, therefor.

Signed and Sealed this

Twentieth Day of July, 2004

JON W. DUDAS
*Acting Director of the United States Patent and Trademark Office*